US012660519B2

(12) United States Patent
Kim et al.

(10) Patent No.: US 12,660,519 B2
(45) Date of Patent: Jun. 16, 2026

(54) MULTI-REGIONAL EPITAXIAL GROWTH AND RELATED SYSTEMS AND ARTICLES

(71) Applicant: Massachusetts Institute of Technology, Cambridge, MA (US)

(72) Inventors: Jeehwan Kim, Cambridge, MA (US); Yunjo Kim, Cambridge, MA (US); Sanghoon Bae, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 609 days.

(21) Appl. No.: 17/639,951

(22) PCT Filed: Sep. 3, 2020

(86) PCT No.: PCT/US2020/049276
§ 371 (c)(1),
(2) Date: Mar. 3, 2022

(87) PCT Pub. No.: WO2021/046269
PCT Pub. Date: Mar. 11, 2021

(65) Prior Publication Data
US 2022/0328311 A1      Oct. 13, 2022

Related U.S. Application Data

(60) Provisional application No. 62/895,863, filed on Sep. 4, 2019.

(51) Int. Cl.
*H01L 21/02*          (2006.01)
*C23C 16/26*          (2006.01)
(Continued)

(52) U.S. Cl.
CPC .......... *H10P 14/3418* (2026.01); *C23C 16/26* (2013.01); *C23C 16/56* (2013.01);
(Continued)

(58) Field of Classification Search
CPC ......... C23C 16/26; C23C 16/56; C30B 23/04; C30B 25/04; H01L 21/02389;
(Continued)

(56) References Cited

U.S. PATENT DOCUMENTS 8,409,366 B2      4/2013  Ogihara et al.
10,770,289 B2      9/2020  Kim et al.
(Continued)

FOREIGN PATENT DOCUMENTS

WO      WO 2008/036837 A2      3/2008
WO      WO 2014/190352 A1      11/2014
(Continued)

OTHER PUBLICATIONS

International Preliminary Report on Patentability for Application No. PCT/US2020/049276, mailed Mar. 17, 2022.
(Continued)

*Primary Examiner* — Hua Qi
(74) *Attorney, Agent, or Firm* — Wolf, Greenfield & Sacks, P.C.

(57) ABSTRACT

Epitaxial growth of materials, and related systems and articles, are generally described.

28 Claims, 7 Drawing Sheets

| 105 |
| 110 |

| 115 |
| 105 |
| 110 |

(51) Int. Cl.

| | |
|---|---|
| *C23C 16/56* | (2006.01) |
| *C30B 23/04* | (2006.01) |
| *C30B 25/04* | (2006.01) |
| *H10P 14/20* | (2026.01) |

(52) U.S. Cl.

CPC .............. *C30B 23/04* (2013.01); *C30B 25/04* (2013.01); *H10P 14/272* (2026.01); *H10P 14/2909* (2026.01); *H10P 14/3206* (2026.01); *H10P 14/3218* (2026.01); *H10P 14/3221* (2026.01); *H10P 14/3251* (2026.01)

(58) Field of Classification Search

CPC ......... H01L 21/02392; H01L 21/02395; H01L 21/02444; H01L 21/02447; H01L 21/0245; H01L 21/02458; H01L 21/02461; H01L 21/02463; H01L 21/02499; H01L 21/02505; H01L 21/02507; H01L 21/02521; H01L 21/02543; H01L 21/02642

See application file for complete search history.

(56) References Cited

U.S. PATENT DOCUMENTS

| | | | | |
|---|---|---|---|---|
| 2004/0048091 | A1* | 3/2004 | Sato | .................. H01L 21/76254 |
| | | | | 438/455 |
| 2007/0287269 | A1* | 12/2007 | Yokokawa | ........ H01L 21/76254 |
| | | | | 257/E21.129 |
| 2010/0147370 | A1 | 6/2010 | He et al. | |
| 2011/0244662 | A1 | 10/2011 | Lee et al. | |
| 2012/0141799 | A1 | 6/2012 | Kub et al. | |
| 2013/0285016 | A1 | 10/2013 | Wei et al. | |
| 2013/0288458 | A1 | 10/2013 | Wei et al. | |
| 2014/0220764 | A1 | 8/2014 | Bayram et al. | |
| 2015/0084074 | A1* | 3/2015 | Bayram | .............. H01L 21/0254 |
| | | | | 257/94 |
| 2017/0018614 | A1 | 1/2017 | Rupp et al. | |
| 2018/0175213 | A1* | 6/2018 | Colinge | ............. H10D 84/0193 |
| 2018/0197736 | A1* | 7/2018 | Kim | .................. H01L 21/02642 |
| 2020/0286786 | A1 | 9/2020 | Kim et al. | |
| 2022/0157661 | A1 | 5/2022 | Kim et al. | |

FOREIGN PATENT DOCUMENTS

| | | | |
|---|---|---|---|
| WO | WO 2017/044577 | A1 | 3/2017 |
| WO | WO 2017/222796 | A2 | 12/2017 |
| WO | WO 2018/089444 | A1 | 5/2018 |
| WO | WO 2018/156876 | A1 | 8/2018 |
| WO | WO 2018/195152 | A1 | 10/2018 |
| WO | WO-2018195412 | A1 * | 10/2018 ....... H01L 21/02293 |
| WO | WO 2019/099461 | A1 | 5/2019 |
| WO | WO 2019/099461 | A9 | 5/2019 |
| WO | WO 2019/246515 | A1 | 12/2019 |
| WO | WO 2020/041650 | A1 | 2/2020 |
| WO | WO 2020/072867 | A1 | 4/2020 |
| WO | WO 2020/072871 | A1 | 4/2020 |
| WO | WO 2020/081623 | A1 | 4/2020 |

OTHER PUBLICATIONS

Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.

Kim et al., 9.4% efficient amorphous silicon solar cell on high aspect-ratio glass microcones. Adv Mater. Jun. 2014;26(24):4082-6. Epub Mar. 20, 2014.

Kim et al., High efficiency Cu2ZnSn(S,Se)4 solar cells by applying a double In2S3/CdS emitter. Adv Mater. Nov. 2014;26(44):7427-31. Epub Aug. 25, 2014.

Kim et al., Fabrication of dislocation-free tensile strained Si thin films using controllably oxidized porous Si substrates. Appl Phys Lett. 2006;89(15):152117(1-3). Epub Oct. 12, 2006.

Kim et al., A method for fabricating dislocation-free tensile-strained SiGe films via the oxidation of porous Si substrates. Appl Phys Lett. 2007;91(25):252108(1-3). Epub Dec. 19, 2007.

Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.

Kim et al., Principle of direct van der Waals epitaxy of single-crystalline films on epitaxial graphene. Nat Commun. Sep. 2014;5:4836. doi:10.1038/ncomms5836, 7 pages.

Kim et al., Layer-resolved graphene transfer via engineered strain layers. Science. Nov. 15, 2013;342(6160):833-6.

Kim et al., Remote epitaxy through graphene enables two-dimensional material-based layer transfer. Nature. Apr. 20, 2017;544(7650):340-3. doi: 10.1038/nature22053. Methods included. 12 pages total.

Kong et al., Polarity governs atomic interaction through two-dimensional materials. Nat Mater. Nov. 2018;17:999-1005.

Invitation to Pay Additional Fees from International Patent Application No. PCT/US2020/049276, mailed Dec. 4, 2020.

International Search Report from International Patent Application No. PCT/US2020/049276, mailed Mar. 11, 2021.

Written Opinion of the International Searching Authority from International Patent Application No. PCT/US2020/049276, mailed Mar. 11, 2021.

* cited by examiner

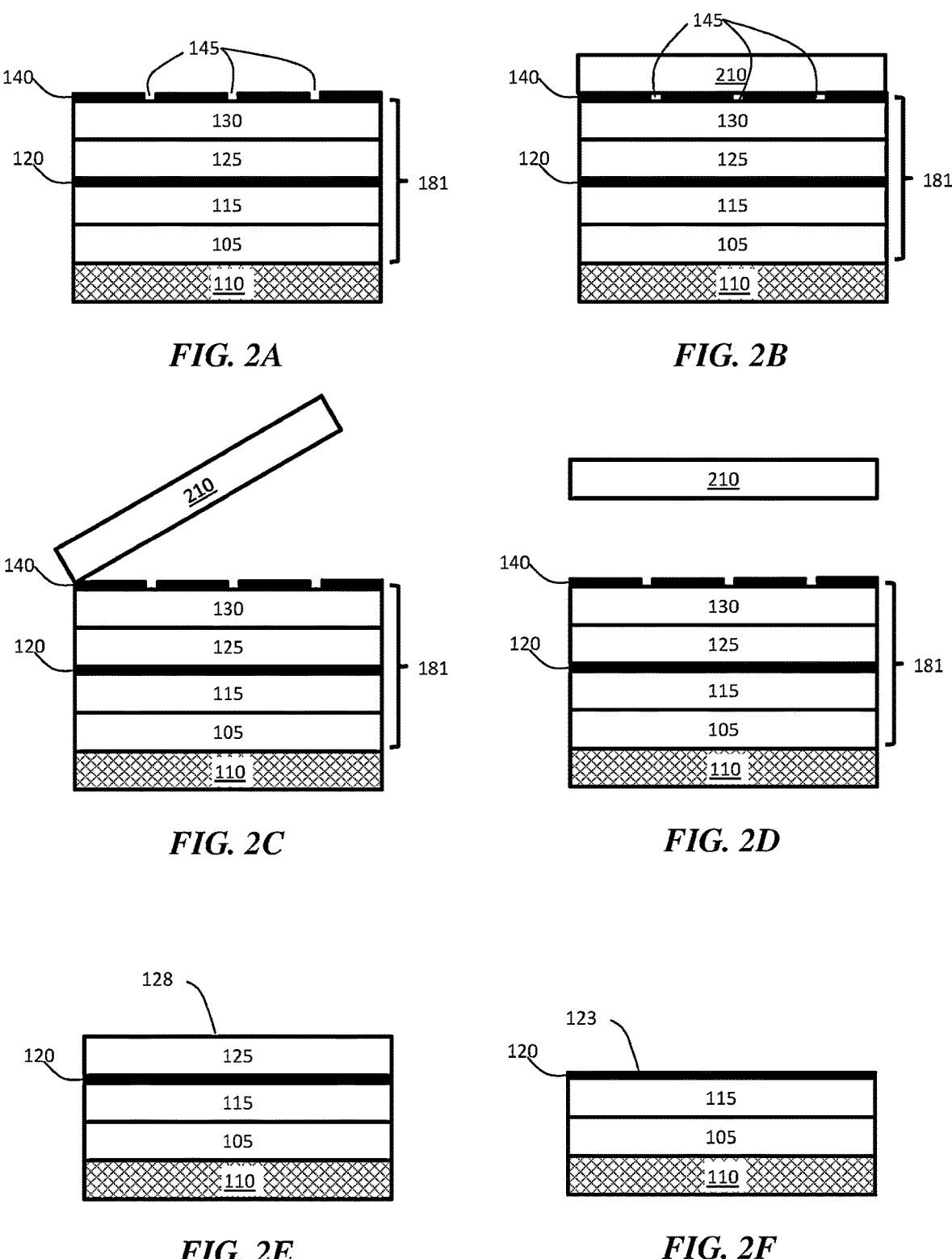
*FIG. 2A*                    *FIG. 2B*
*FIG. 2C*                    *FIG. 2D*
*FIG. 2E*                    *FIG. 2F*

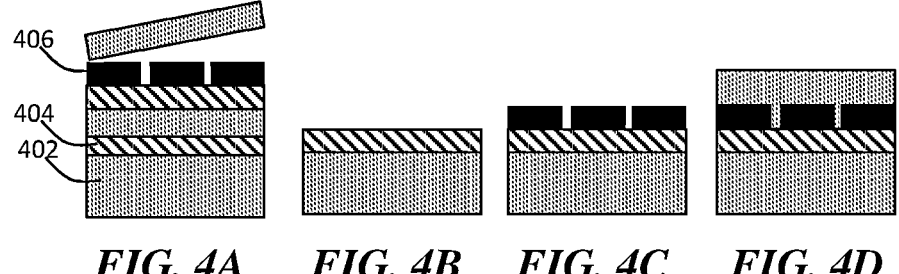
406
404
402
*FIG. 4A*    *FIG. 4B*    *FIG. 4C*    *FIG. 4D*

MULTI-REGIONAL EPITAXIAL GROWTH AND RELATED SYSTEMS AND ARTICLES

RELATED APPLICATIONS

This application is a national stage filing under 35 U.S.C. § 371 of International Patent Application No. PCT/US2020/049276, filed Sep. 3, 2020, and entitled "Multi-Regional Epitaxial Growth and Related Systems and Articles," which claims priority under 35 U.S.C. § 119(e) to U.S. Provisional Application No. 62/895,863, filed Sep. 4, 2019, and entitled "Multi-Regional Epitaxial Growth and Related Systems and Articles," each of which is incorporated herein by reference in its entirety for all purposes.

GOVERNMENT SPONSORSHIP

This invention was made with government support under D19AP00037 awarded by the Defense Advanced Research Projects Agency (DARPA). The government has certain rights in this invention.

TECHNICAL FIELD

Epitaxial growth of materials, and related systems and articles, are generally described.

BACKGROUND

In advanced electronic and photonic technologies, devices are frequently fabricated from functional semiconductors, such as III-N semiconductors, III-V semiconductors, II-VI semiconductors, and Ge. The lattice constants of these functional semiconductors often do not match the lattice constants of silicon substrates. Lattice constant mismatch between a substrate and an epitaxial layer on the substrate can introduce strain into the epitaxial layer, thereby preventing epitaxial growth of thicker layers without defects. Therefore, non-silicon substrates are usually employed as base layers for epitaxial growth of most functional semiconductors. However, non-Si substrates with lattice constants matching those of functional materials can be costly and therefore limit the development of non-Si electronic/photonic devices.

One method to address the high cost of non-silicon substrates is the "layer-transfer" technique, in which functional device layers are grown on lattice-matched substrates and then removed and transferred to other substrates. The remaining lattice-matched substrates can then be reused to fabricate another device layer, thereby reducing the cost.

Many layer-transfer techniques have certain disadvantages that have limited their use in certain cases. Accordingly, improved methods for achieving layer transfer are desirable.

SUMMARY

Epitaxial growth of materials, and related systems and articles, are generally described. Certain embodiments are related to articles comprising multiple layers of single-crystalline material, which each may be used as base layers for the growth of additional single-crystalline materials. According to some embodiments, an upper layer of single-crystalline material may be used as a base layer to grow one or more additional single-crystalline materials. In some such embodiments, once the upper layer of single-crystalline material is no longer suitable for use as a base layer, the upper layer and an underlying etch stop layer can be removed to make a single-crystalline underlayer available as a base layer for subsequent growth. The single-crystalline underlayer may then be used as a base layer to grow additional single-crystalline materials.

The subject matter of the present invention involves, in some cases, interrelated products, alternative solutions to a particular problem, and/or a plurality of different uses of one or more systems and/or articles.

Certain aspects are directed to a method. In some embodiments, the method comprises growing a first single-crystalline material over a stack comprising a two-dimensional (2D) material, a first single-crystalline underlayer below the 2D material, a first etch stop layer below the first single-crystalline underlayer, and a second single-crystalline underlayer below first etch stop layer, such that the first single-crystalline material is substantially epitaxially matched to the first single-crystalline underlayer below the 2D material and/or epitaxially matched to the 2D material; separating the first single-crystalline material from at least the first single-crystalline underlayer, the first etch stop layer, and the second single-crystalline underlayer; removing at least a portion of the first single-crystalline underlayer and exposing at least a portion of a surface of the first etch stop layer; removing at least a portion of the first etch stop layer and exposing at least a portion of a surface of the second single-crystalline underlayer and/or at least a portion of a surface of an optional second 2D material; and growing a second single-crystalline material over the second single-crystalline underlayer.

In some embodiments, a method comprises depositing a first single-crystalline etch stop layer onto a single-crystalline substrate; depositing a first single-crystalline base layer over the first single-crystalline etch stop layer; depositing a second single-crystalline etch stop layer over the first single-crystalline base layer; and depositing a second single-crystalline base layer over the second single-crystalline etch stop layer.

Certain aspects are directed to a structure. In some embodiments, the structure comprises a single-crystalline substrate; and a plurality of single-crystalline etch stop layers and a plurality of single-crystalline base layers over the single-crystalline substrate in an alternating arrangement, wherein one of the plurality of single-crystalline etch stop layers is directly adjacent to the single-crystalline substrate.

In some embodiments, a structure comprises a single-crystalline substrate; and a multi-layer stack over the single-crystalline substrate, the multi-layer stack comprising: a first single-crystalline etch stop layer over the single-crystalline substrate; a first single-crystalline base layer over the first single-crystalline etch stop layer; a second single-crystalline etch stop layer over the first single-crystalline base layer; and a second single-crystalline base layer over the second single-crystalline etch stop layer.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 2A-2L are exemplary cross-sectional schematic illustrations showing the use of a multi-layer structure to grow a plurality of single-crystalline materials, in accordance with some embodiments;

FIGS. 4A-4D are a process schematic diagram series, in accordance with some embodiments; FIG. 4A is a schematic diagram relating to indium phosphide (InP) growth on patterned graphene on a stack comprising InGaAs/InP/ InGaAs . . . /InP, in accordance with some embodiments; FIG. 4B is a schematic diagram relating to etching the patterned graphene and an InGaAs layer to obtain a pristine InP surface for further InP growth, in accordance with some embodiments; FIG. 4C is a schematic diagram relating to transferring or growing graphene onto the pristine InP surface and forming periodic patterns in the graphene layer, in accordance with some embodiments; and FIG. 4D is a schematic diagram relating to InP epitaxial growth on the patterned graphene/InP/InGaAs/ . . . /InP/InGaAs layered architecture, in accordance with some embodiments;

DETAILED DESCRIPTION

Figures 1A, 1B, 1C, 1D, 1E, 1F, 1G:
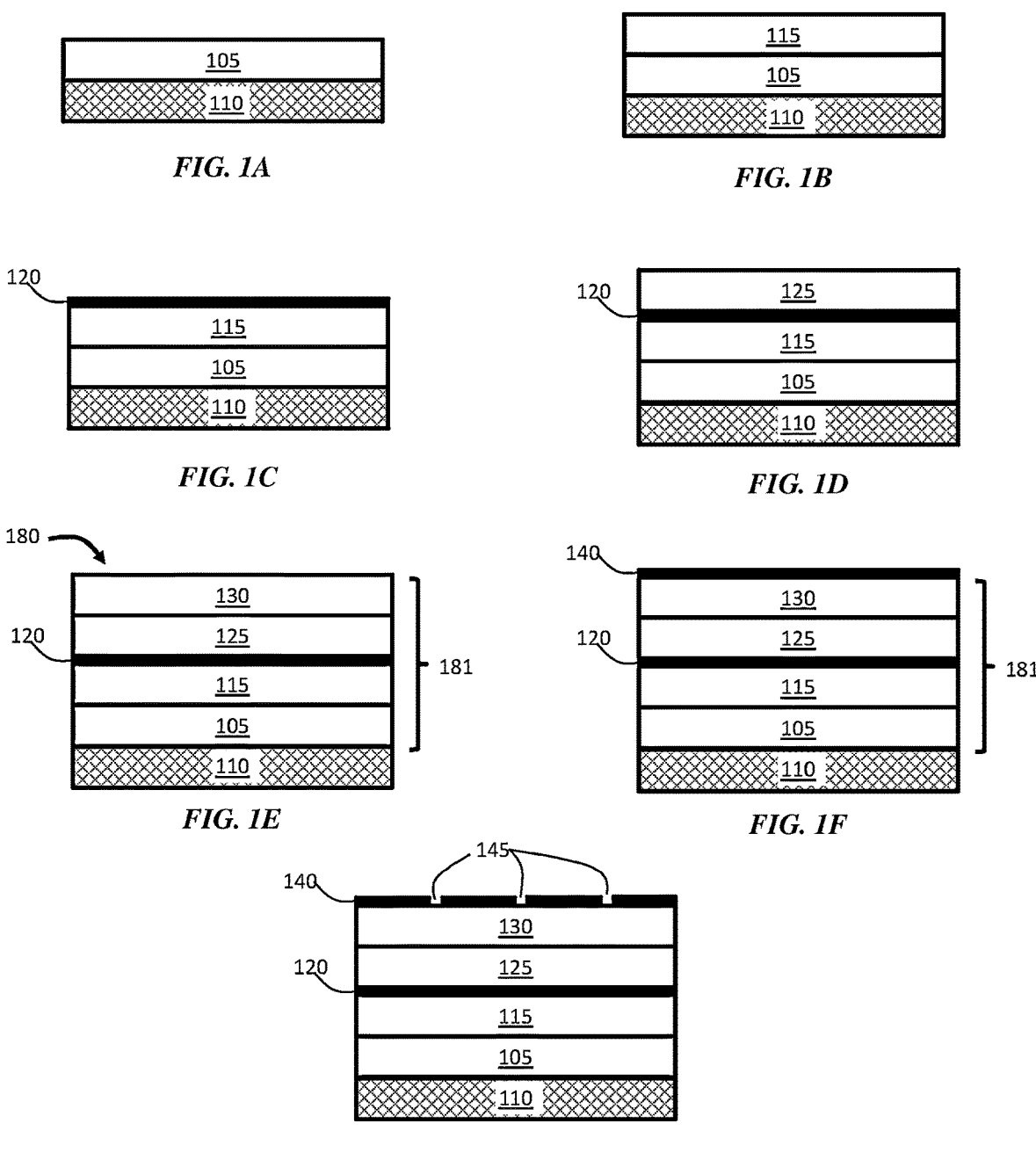
FIGS. 1A-1G are, in accordance with certain embodiments, exemplary cross-sectional schematic illustrations showing the formation of a multi-layer structure.

Epitaxial growth of materials, and related systems and articles, are generally described.

Certain embodiments are related to articles comprising multiple layers of single-crystalline material. In some embodiments, each of the layers of single-crystalline material can be used (optionally in combination with a 2D material such as graphene) as a base to grow one or more new single-crystalline materials. In some embodiments, etch stop layers are positioned between the single-crystalline material layers (e.g., in an alternating arrangement of single-crystalline material layers and etch stop layers). Each of the etch stop layers can allow for the removal of an overlying single-crystalline material layer (e.g., when the overlying single-crystalline material layer is no longer suitable for serving as a base for the growth of single-crystalline material) without damaging the single-crystalline material layer (s) that are underneath the etch stop layer. Arranging the single-crystalline material layers and the etch stop layers in this way can allow one to provide, within a single article, a large number (e.g., two, three, four, five, ten, or more) of single-crystalline surfaces suitable as bases for the growth of additional single-crystalline material.

Methods of growing single-crystalline materials from articles comprising multiple single-crystalline base layers are also provided. For example, in some embodiments, an upper layer of single-crystalline material may be used as a base for the growth of one or more additional single-crystalline material layers. In some such embodiments, once the upper layer of single-crystalline material is no longer suitable for use as a base layer, the upper layer and an underlying etch stop layer can be removed to make a single-crystalline underlayer available for subsequent growth (e.g., by exposing a single-crystalline underlayer and/or a 2D material). The single-crystalline underlayer may then be used as a base for additional growth of single-crystalline materials. In some embodiments, this process (i.e., growth on a first base layer, removal of the base layer and an underlying etch stop layer to expose an underlying layer, growth on the underlying layer, etc.) can be repeated a plurality of times until all of the single-crystalline base layers have been used.

Certain of the articles, systems, and methods described herein can provide advantages relative to other layer-transfer processes. For example, in certain embodiments, the presence of multiple base layers allows one to continue to reuse a substrate, even if the terminal base layer has been roughened or otherwise damaged during the removal of a single-crystalline material layer. In addition, use of the articles and methods described herein can, in accordance with certain embodiments, allow for the growth of different types of single-crystalline materials using the same substrate (e.g., by including multiple types of base layers within the multi-layer structure).

As noted above, certain embodiments are related to methods of forming a multi-layer structure. FIGS. 1A-1G are cross-sectional schematic illustrations showing an exemplary method in accordance with certain embodiments.

The method can comprise, in some embodiments, depositing a first single-crystalline etch stop layer onto a substrate. For example, referring to FIG. 1A, single-crystalline etch stop layer 105 has been deposited onto substrate 110.

A variety of types of substrates can be used. In certain embodiments, the substrate is a single-crystalline substrate. In some such embodiments, the single-crystalline substrate comprises a single-crystalline semiconductor, such as InGaN, InGaP, silicon (Si), and silicon carbide (SiC). Additional examples of suitable substrates (single-crystalline and otherwise) are described in more detail below.

A variety of types of single-crystalline etch stop layers can also be used.

Generally, the material from which the etch stop layer is made will depend upon the type of single-crystalline base layer (described below) one desires to form. Non-limiting examples of etch stop layers include Ge, AlAs, and InGaAs. Additional examples are disclosed below. In addition, specific examples of etch stop materials that can be used with specific base layers are described in more detail below.

The etch stop layer can be deposited onto the substrate using any of a variety of suitable techniques. Non-limiting examples of deposition techniques include, but are not limited to, molecular-beam epitaxy (MBE), chemical vapor deposition (CVD) (including, but not limited to, metal-organic chemical vapor deposition (MOCVD)), and pulsed laser deposition (PLD).

In some embodiments, depositing the first single-crystalline etch stop layer comprises growing the first single-crystalline etch stop layer onto the substrate. Single-crystalline etch stop layers may be grown onto the substrate using a variety of suitable techniques. Non-limiting examples of epitaxial growth techniques include, but are not limited to, molecular-beam epitaxy (MBE), chemical vapor deposition (including, but not limited to, metal-organic chemical vapor deposition (MOCVD)), and pulsed laser deposition (PLD).

In other embodiments, depositing the first single-crystalline etch stop layer comprises transferring the first single-crystalline etch stop layer onto the substrate. In some embodiments, a first single-crystalline etch stop material may be transferred using graphene and/or another 2D material as a platform. For example, in some embodiments, a single-crystalline etch stop layer can be fabricated on a graphene layer (or another 2D material layer) that is positioned over a secondary substrate. The single-crystalline etch stop layer can then, according to certain embodiments, be removed from the secondary substrate (e.g., by exfoliation of the graphene and/or the other 2D material) and transferred to the substrate (e.g., substrate 110 in FIG. 1A). Exemplary methods for growing single-crystalline materials over graphene and underlying substrates, and their subsequent removal, are described, for example, in International Patent Application Publication No. WO 2017/044577, published on Mar. 16, 2017, filed as International Application No. PCT/US2016/050701 on Sep. 8, 2016, and entitled "Systems and Methods for Graphene Based Layer Transfer," which is incorporated herein by reference in its entirety for all purposes.

In some embodiments, the first single-crystalline etch stop layer and the substrate can be substantially epitaxially matched. As used herein, two material layers are said to be substantially epitaxially matched if their lattice mismatches are 70% or less. In some embodiments, two material layers that are substantially epitaxially matched have lattice mismatches of 60% or less, 50% or less, 40% or less, 30% or less, 20% or less, or 10% or less. The lattice mismatch (LM) between material A (having a first lattice constant $C_A$) and material B (having a second lattice constant $C_B$ which is smaller than first lattice constant $C_A$) is calculated as follows:

$$LM = \frac{C_A - C_B}{C_B} \times 100\% \qquad [1]$$

In certain embodiments, the first single-crystalline etch stop layer is in direct contact with the substrate. In other embodiments, there are one or more intervening materials between the first single-crystalline etch stop layer and the substrate.

The method can comprise, in some embodiments, depositing a first single-crystalline base layer over the first single-crystalline etch stop layer. For example, referring to FIG. 1B, first single-crystalline base layer 115 has been deposited onto first single-crystalline etch stop layer 105.

The term "base" is used to refer to certain layers throughout the specification. The term "base" is used primarily for reference purposes, and it should be understood that a base layer can be any layer capable of supporting the growth of a crystalline material over it. In some embodiments, the "base" layer seeds the growth of a single crystalline layer that is grown over it (in which case, the base layer and the grown single crystalline material would be substantially epitaxially matched). In other cases, the base layer does not seed the growth of a single crystalline layer that is grown over it.

In some embodiments in which the base layer seeds the growth of a single crystalline material that is grown over it, the base layer and the single crystalline material are in direct contact. In other embodiments, a material can be between the base layer and the single crystalline material layer that is being seeded by the base layer. For example, in accordance with certain embodiments, the base layer may have a potential field (e.g., created by van der Waals forces and/or other atomic or molecular forces) and a 2D material (e.g., one or more layers of graphene) may be positioned over the base layer but may be so thin that the potential field of the base layer reaches beyond the 2D material and interacts with the region within which a single crystalline layer is formed. As a result, in some embodiments, the potential field from the base layer can affect the growth of the single crystalline material even if the base layer is covered by the 2D material such that there is no direct contact between the base layer and the single crystalline material being grown. Examples of such growth are described, for example, in International Patent Application Publication No. WO 2017/044577, published on Mar. 16, 2017, filed as International Application No. PCT/US2016/050701 on Sep. 8, 2016, and entitled "Systems and Methods for Graphene Based Layer Transfer," which is incorporated herein by reference in its entirety for all purposes.

Various techniques can be used to deposit a single-crystalline base layer. In some embodiments, the single-crystalline base layer is grown over the single-crystalline etch stop layer. Non-limiting examples of suitable methods for growing the single-crystalline base layer include, but are not limited to molecular-beam epitaxy (MBE), chemical vapor deposition (including, but not limited to, metal-organic chemical vapor deposition (MOCVD)), and pulsed laser deposition (PLD).

In some embodiments, the first single-crystalline base layer may be transferred using graphene and/or another 2D material as a platform. For example, in some embodiments, a single-crystalline base layer can be fabricated on a graphene layer (or another 2D material layer) that is positioned over a secondary substrate. The single-crystalline base layer can then, according to certain embodiments, be removed from the secondary substrate (e.g., by exfoliation of the graphene and/or other 2D material) and transferred such that it is positioned over the single-crystalline substrate (e.g., substrate 110 in FIG. 1B) and the first single-crystalline etch stop layer (e.g., layer 105 in FIG. 1B). Exemplary methods for growing single-crystalline materials over graphene and underlying substrates, and their subsequent removal, are described, for example, in International Patent Application Publication No. WO 2017/044577, referenced above.

In some embodiments, the first single-crystalline base layer and the first single-crystalline etch stop layer are substantially epitaxially matched. In certain embodiments, the first single-crystalline base layer is in direct contact with the first single-crystalline etch stop layer. In other embodiments, there are one or more intervening materials between the first single-crystalline base layer and the first single-crystalline etch stop layer.

In some embodiments, the method can further comprise depositing a 2D material onto the single crystalline base layer. In some embodiments, the 2D material is deposited directly onto the single crystalline base layer. For example, FIG. 1C shows 2D material 120 deposited directly onto first single-crystalline base layer 115. In other cases, the 2D material is deposited over the base layer as well as an intermediate layer. For example, in some embodiments, one or more intermediate layers can be present between 2D material 120 and single-crystalline base layer 115.

Terms that describe the relative spatial positions of components (e.g., "above," "below," "over," "under," etc.) are generally used herein for ease of description and understanding of the relative arrangement of components, for example, as shown in the accompanying figures. As would be understood by a person of ordinary skill in the art, however, claims reciting such terms are intended to encompass varying orientations of the articles comprising those components, as long as the components are positioned relative to each other in a manner consistent with the recitations in the claims. For example, features described as being "below" or "under" other features would, after the article is turned upside down, be oriented "above" or "on top of" the other features. As another example, features described as being "below" or "under" other features would, after the article is rotated 90 degrees counter-clockwise, be oriented "to the right of" the other features.

When a structure (e.g., layer and/or device) is referred to as being "on," "over," or "overlying" another structure (e.g., layer or substrate), it can be directly on the structure, or an intervening structure (e.g., a solid material, air gap, etc.) also may be present. A structure that is "directly on" or "directly over" or "in direct contact with" another structure, or place "directly onto" another structure, means that no intervening structure is present. It should also be understood that when a structure is referred to as being "on" or "over" another structure, it may cover the entire structure, or a portion of the structure.

A variety of 2D materials may be used. In some embodiments, the 2D material is or comprises graphene. In certain embodiments, the 2D material can comprise a transition metal dichalcogenide (TMD) monolayer, which is an atomically thin semiconductor of the type $MQ_2$, where M is a transition metal atom (e.g., Mo, W, etc.) and Q is a chalcogen atom (e.g., S, Se, or Te). In some embodiments, the 2D material can include $MoS_2$ and $WSe_2$, among other materials. In yet another example, the 2D material can comprise 2D boron nitride (BN). In some embodiments, the 2D material can be arranged as a plurality of atomic layers (e.g., 2, 3, 4, 5, 6, 7, or more atomic layers). For example, in some embodiments, a plurality of graphene layers (e.g., 2, 3, 4, 5, 6, 7, or more graphene layers thick) can be used. In some embodiments, the 2D material is an atomically thin material.

Various techniques can be used to deposit a 2D material. In some embodiments, the 2D material is grown over the single-crystalline base layer. Non-limiting examples of suitable methods for growing the 2D material include, but are not limited to, molecular-beam epitaxy (MBE), chemical vapor deposition (including, but not limited to, metal-organic chemical vapor deposition (MOCVD)), and pulsed laser deposition (PLD). As one non-limiting example, in some embodiments, the 2D material comprises graphene, and the graphene is grown over the single-crystalline base layer using a multistep annealing process. In one such process, a first annealing step is performed in $H_2$ gas (for surface etching and vicinalization), and a second annealing step is performed in Ar for graphitization at high temperatures (e.g., at 1500° C. or higher). As another non-limiting example, a graphene 2D material can be grown using chemical vapor deposition (CVD). As yet another non-limiting example, the graphene can be formed using a mechanical exfoliation process.

In some embodiments, the 2D material may be transferred from another substrate. For example, in some embodiments, a 2D material can be grown over a secondary substrate. The 2D material can then, according to certain embodiments, be removed from the secondary substrate (e.g., by exfoliation) and transferred such that it is positioned over the substrate (e.g., substrate 110 in FIG. 1C), the first single-crystalline etch stop layer (e.g., layer 105 in FIG. 1C), and the first single-crystalline base layer (e.g., layer 115 in FIG. 1C). Exemplary methods for growing 2D materials over underlying substrates, and their subsequent removal, are described, for example, in International Patent Application Publication No. WO 2017/044577, referenced above. As one non-limiting embodiment, a graphene layer can be grown on a first substrate, and a carrier film (e.g., comprising poly (methyl methacrylate (PMMA), thermal release tape, polydimethylsiloxane (PDMS), and/or the like) can be attached to the graphene layer. The carrier film can then be used to transfer the graphene such that it is positioned over the single-crystalline base layer, after which the carrier film can be removed (e.g., via dissolution).

In some embodiments, the 2D material and the first single-crystalline base layer are substantially epitaxially matched.

The method may further comprise depositing a second single-crystalline etch stop layer over the first single-crystalline base layer. FIG. 1D shows second single-crystalline etch stop layer 125 over first single-crystalline base layer 115. The second single-crystalline etch stop layer may be deposited (e.g., grown or transferred) using any of the methods described above with respect to the first single-crystalline etch stop layer. In some embodiments, the second single-crystalline etch stop layer is deposited using the same technique used to deposit the first single-crystalline etch stop layer. In other embodiments, the first and second single-crystalline etch stop layers are deposited using different techniques.

In some embodiments, the first single-crystalline etch stop layer and the second single-crystalline etch stop layer are made of the same material. In other embodiments, the first single-crystalline etch stop layer is made of a first material, and the second single-crystalline etch stop layer is made of a second, different material. For example, in some embodiments, the first single-crystalline etch stop layer and the second single-crystalline etch stop layer comprise or are made of AlAs. As another example, in some embodiments, the first single-crystalline etch stop layer and the second single-crystalline etch stop layer comprise or are made of InGaAs.

In some embodiments, the second single-crystalline etch stop layer is deposited over the 2D material. This can be achieved, for example, by depositing the 2D material before depositing the second single-crystalline etch stop layer. For example, as shown in FIG. 1D, 2D material 120 is deposited over single-crystalline base layer 115 before single-crystalline etch stop layer 125 is deposited over single-crystalline base layer 115, resulting in the second single-crystalline etch stop layer 125 being deposited over 2D material 120.

It should be understood, however, that the presence of a 2D material layer is optional, and in other embodiments, the single-crystalline etch stop layer is deposited over the single-crystalline base layer without a 2D material being present. In some such embodiments, the single-crystalline etch stop layer is deposited over the single-crystalline base layer such that the single-crystalline etch stop layer is in direct contact with the single-crystalline base layer.

In some embodiments, the second single-crystalline etch stop layer and the first single-crystalline base layer are substantially epitaxially matched. In certain embodiments, the second single-crystalline etch stop layer is in direct contact with the first single-crystalline base layer. In other embodiments, there are one or more intervening materials between the second single-crystalline etch stop layer and the first single-crystalline base layer.

In some embodiments, the method comprises depositing a second single-crystalline base layer over the second single-crystalline etch stop layer. For example, FIG. 1E illustrates second single-crystalline base layer 130 over second single-crystalline etch stop layer 125. The second single-crystalline base layer may be deposited (e.g., grown or transferred) using any of the techniques described above with respect to the first single-crystalline base layer. In some embodiments, the second single-crystalline base layer is deposited using the same technique used to deposit the first single-crystalline base layer. In other embodiments, the first and second single-crystalline base layers are deposited using different techniques.

In some embodiments, the first single-crystalline base layer and the second single-crystalline base layer are made of the same material. For example, in some embodiments, both the first single-crystalline base layer and the second single-crystalline base layer are made of GaN. In other embodiments, the first single-crystalline base layer is made of a first material (e.g., GaN), and the second single-crystalline base layer is made of a second, different material (e.g., AlGaN).

In some embodiments, the second single-crystalline base layer and the second single-crystalline etch stop layer are substantially epitaxially matched. In certain embodiments, the second single-crystalline base layer is in direct contact with the second single-crystalline etch stop layer. In other embodiments, there are one or more intervening materials between the second single-crystalline base layer and the second single-crystalline etch stop layer.

In certain embodiments, one or more additional etch stop layers and one or more additional base layers may be deposited over the substrate. In some such embodiments, an optional 2D material may be deposited such that 2D material is present between the single-crystalline base layer and the overlying single-crystalline etch stop layer.

Certain embodiments are related to inventive structures. One exemplary structure is shown in the cross-sectional schematic illustration of FIG. 1E.

The structure can comprise, in some embodiments, a substrate (e.g., a single-crystalline substrate). For example, in FIG. 1E, structure 180 comprises single-crystalline substrate 110.

In some embodiments, the structure comprises a multi-layer stack over the substrate. In some embodiments, the multi-layer stack comprises a first single-crystalline etch stop layer over the substrate. For example, referring to FIG. 1E, multi-layer stack 181 comprises first single-crystalline etch stop layer 105 over substrate 110. In certain embodiments, the multi-layer stack comprises a first single-crystalline base layer over the first single-crystalline etch stop layer. For example, referring to FIG. 1E, multi-layer stack 181 comprises first single-crystalline base layer 115 over first single-crystalline etch stop layer 105. In some embodiments, the multi-layer stack comprises a second single-crystalline etch stop layer over the first single-crystalline base layer. For example, referring to FIG. 1E, multi-layer stack 181 comprises second single-crystalline etch stop layer 125 over first single-crystalline base layer 115. In some embodiments, the multi-layer stack comprises a second single-crystalline base layer over the second single-crystalline etch stop layer. For example, referring to FIG. 1E, multi-layer stack 181 comprises second single-crystalline base layer 130 over second single-crystalline etch stop layer 125.

In some embodiments, the structure may further comprise a two-dimensional (2D) material between the first single-crystalline base layer and the second single-crystalline etch stop layer. FIG. 1E, for example, shows 2D material 120 between first single-crystalline base layer 115 and second single-crystalline etch stop layer 125. In some embodiments, the 2D material comprises graphene. Other examples of 2D materials are described elsewhere herein.

As noted above, the presence of 2D material between the first single-crystalline base layer and the second single-crystalline etch stop layer is optional, and in other embodiments, no 2D material is present. In some embodiments, the first single-crystalline base layer and the second single-crystalline etch stop layer are in direct contact.

In some embodiments, the structure may further comprise a 2D material over the second single-crystalline base layer. One example is shown in FIG. 1F, in which 2D material 140 is over second single-crystalline base layer 130. 2D material 140 may be formed, for example, using any of the processes outlined above with respect to optional 2D material 120.

In some embodiments, the 2D material is patterned with at least one through-hole. For example, in FIG. 1G, 2D material 140 includes through-holes 145.

In some embodiments, the through-hole(s) open and extend through both faces of the 2D material. The through-hole(s) can be on the nanoscale. For example, the diameter of the through-hole(s) can be less than 1 μm. In some embodiments, the through-hole(s) have diameters of less than 1 μm, less than 500 nm, less than 300 nm, less than 200 nm, less than 100 nm, less than 50 nm, or less. In certain embodiments, the through-hole(s) have diameters of at least 10 nm, at least 50 nm, at least 100 nm, at least 200 nm, at least 300 nm, or at least 500 nm. Combinations of these ranges are also possible (e.g., less than 1 μm and at least 10 nm). Other ranges are also possible.

Various methods can be used to form the through-hole(s). In one example, a metal mask can be formed on the 2D material. For example, metal deposition can be initiated on the 2D material to form a metal island. The metal island, in some examples, forms the metal mask. Then plasma etching can be employed, in accordance with certain embodiments, to etch the area of the 2D material not covered by the metal mask. As another example, metal deposition can be initiated on the 2D material to form a metal mask comprising a metal layer having at least one through-hole in the metal mask disposed on the 2D material. Then, plasma etching can be employed to etch the areas of the 2D material not covered by the metal mask (e.g., through the at least one through-hole in the metal mask). The plasma can include, for example, oxygen plasma or inert gas plasma (e.g., He plasma or Ar plasma). After the etching of the 2D material, in accordance with certain embodiments, the metal mask can be etched away (e.g., using wet chemical etching), exposing the through-hole of the 2D material for further processing.

In some embodiments, the structure may further comprise a 2D material as a terminal layer above a terminal single-crystalline base layer. FIGS. 1F and 1G, for example, show 2D material 140 as a terminal layer above single-crystalline base layer 130 (which is the terminal single-crystalline base layer in FIGS. 1F and 1G because there is no further single-crystalline base layer above layer 130 in FIGS. 1F and 1G).

In some embodiments, the structure comprises a plurality of single-crystalline etch stop layers and a plurality of single-crystalline base layers over the substrate. For example, in FIG. 1E, structure 180 comprises a plurality of single-crystalline base layers (115 and 130) and a plurality of single-crystalline etch stop layers (105 and 125). In some embodiments, the plurality of single-crystalline etch stop layers and the plurality of single-crystalline base layers are in an alternating arrangement, wherein one of the plurality of single-crystalline etch stop layers is directly adjacent to the substrate. For example, in FIG. 1E the plurality of single crystalline etch stop layers 105 and 125 are in an alternating arrangement with the plurality of single-crystalline base layers 115 and 130 because those layers are arranged, from top to bottom, as follows: single-crystalline base layer 130, etch stop layer 125, single-crystalline base layer 115, and etch stop layer 105. In addition, as shown in FIG. 1E, single-crystalline etch stop layer 105 is directly adjacent to substrate 110.

In some embodiments, the structure may further comprise a two-dimensional (2D) material between each single-crystalline base layer and any adjacent single-crystalline etch stop layer that is also farther from a substrate (e.g., from a single-crystalline substrate). For example, the structure may further comprise a two-dimensional (2D) material between each single-crystalline base layer and any adjacent single-crystalline etch stop layer that is also farther from a single-crystalline substrate. In one example, FIG. 1F shows single-crystalline base layer 115 and single-crystalline etch stop layer 125 with 2D material 120 in between. In some embodiments, the structure may further comprise a two-dimensional (2D) material between two single-crystalline base layers. In one example, FIG. 1F shows single-crystalline base layers 130 and 115 with 2D material 120 in between. In other embodiments, the 2D material is optional.

Certain embodiments are related to inventive methods. In accordance with certain inventive methods, combinations of 2D materials and single-crystalline underlayers can be used as a template to form one or more single-crystalline material layers. The single-crystalline material layers can then be removed and used in other applications (e.g., as a device layer in an electronic device). In some embodiments, functional device layers are fabricated on the 2D material, which in turn is disposed on a single-crystalline underlayer that is lattice-matched to the functional device layers. The fabricated device layers can then be removed from the lattice-matched single-crystalline underlayer, for example, using a stressor attached to the functional device layer. In certain such embodiments, the 2D material serves as a reusable and versatile platform for growing device layers and also serves as a release layer that allows fast, precise, and repeatable release at the 2D material layer surface.

As described above, inventive articles can include multiple single-crystalline underlayers. In some embodiments, once a terminal underlayer has been rendered unusable for device layer growth (e.g., due to defect introduction, contamination, etc.), it may be removed from the multi-layer stack, and a second, pristine underlayer may be exposed. Additional growth of device layers may then commence.

One exemplary method in which multiple single-crystalline underlayers are used to grow multiple single-crystalline material layers is described below, with reference to the cross-sectional schematic illustrations shown in FIGS. 2A-2L.

In some embodiments, the method comprises growing a first single-crystalline material over a stack. The stack may comprise, in some embodiments, a two-dimensional (2D) material, a first single-crystalline underlayer below the 2D material, a first etch stop layer below the first single-crystalline underlayer, and a second single-crystalline underlayer below first etch stop layer. For example, referring to FIG. 2A, stack 181 comprises 2D material 140, first single-crystalline underlayer 130 below 2D material 140, first etch stop layer 125 below first single-crystalline underlayer 130, and second single-crystalline underlayer 115 below first etch stop layer 125.

In some embodiments, the stack further comprises a second etch stop layer below the second single-crystalline underlayer. For example, in FIG. 2A, stack 181 comprises second etch stop layer 105 below second single-crystalline underlayer 115. In certain embodiments, the stack is over a substrate (which can be, for example, below the second etch stop layer). For example, in FIG. 2A, stack 181 is over substrate 110.

The layers and materials illustrated in FIG. 2A (including 2D material 140, first single-crystalline underlayer 130, first etch stop layer 125, second single-crystalline underlayer 115, optional 2D material 120, optional second etch stop layer 105, and optional substrate 110) can have any of the properties and may be formed and/or arranged using any of the methods described above with respect to FIGS. 1A-1G.

In some embodiments, the first single-crystalline material is substantially epitaxially matched to the first single-crystalline underlayer and/or to the 2D material. For example, FIG. 2B shows single-crystalline material 210 over stack 181. In some embodiments, first single-crystalline material 210 is substantially epitaxially matched to first single-crystalline underlayer 130 but not to 2D material 140. In some embodiments, first single-crystalline material 210 is substantially epitaxially matched to 2D material 140 but not to first single-crystalline underlayer 130. In some embodiments, first single-crystalline material 210 is substantially epitaxially matched to both 2D material 140 and first single-crystalline underlayer 130.

As noted above, the 2D material may, optionally, be patterned with at least one through-hole. In some embodiments, the 2D material is patterned with at least one through-hole such that growing the first single-crystalline material comprises epitaxially growing the first single-crystalline material on the first single-crystalline underlayer through the at least one through-hole. For example, referring to FIG. 2B, 2D material 140 is patterned with through-holes 145 such that growing first single-crystalline material 210 comprises epitaxially growing first single-crystalline material 210 on first single-crystalline underlayer 130 through through-holes 145. Methods of forming through-holes in 2D materials are described in more detail below. The invention is not limited to the use of patterned 2D materials, however, and in other embodiments, the 2D material may be continuous. In some such embodiments, the 2D material is sufficiently thin that the underlying single crystalline material is capable of seeding the growth of the overlying single crystalline material even when the 2D material is continuous such that there is no direct contact between the base layer and the single crystalline material being grown. For example, in some embodiments, the underlying base layer may have a potential field (e.g., created by van der Waals forces and/or other atomic or molecular forces) and a 2D material (e.g., one or more layers of graphene) may be positioned over the base layer but may be so thin that the potential field of the base layer reaches beyond the 2D material and interacts with the region within which a single crystalline layer is formed. As a result, in some embodiments, the potential field from the base layer can affect the growth of the single crystalline material even if the base layer is covered by a continuous 2D material. Examples of such growth are described, for example, in International Patent Application Publication No. WO 2017/044577, published on Mar. 16, 2017, filed as International Application No. PCT/US2016/050701 on Sep. 8, 2016, and entitled "Systems and Methods for Graphene Based Layer Transfer," which is incorporated herein by reference in its entirety for all purposes.

In some embodiments, the method further comprises separating the first single-crystalline material from at least the first single-crystalline underlayer, the first etch stop layer, and the second single-crystalline underlayer. For example, FIG. 2C shows single-crystalline material 210 being separated from first single-crystalline underlayer 130, first etch stop layer 125, and second single-crystalline underlayer 115. As shown in FIG. 2D, the separation process has produced a first standalone article comprising first single-crystalline material 210 and a second standalone article comprising first single-crystalline underlayer 130, first etch stop layer 125, and second single-crystalline underlayer 115.

In some embodiments, the method comprises removing the first single-crystalline material from the 2D material. For example, as shown in FIG. 2D, 2D material 140 remains over first single-crystalline underlayer 130 after the separation step. In other embodiments, the first single-crystalline material is not separated from the 2D material. For example, in certain embodiments, 2D material 140 can be separated from first single-crystalline underlayer 130 and, optionally, can be in contact with first single-crystalline material 210 after the separation step.

In some embodiments, the separation step also comprises separating the first single-crystalline material from a second etch stop layer and/or an underlying substrate. For example, in FIGS. 2C-2D, first single-crystalline material layer 210 is also separated from second etch stop layer 105 and substrate 110.

A variety of techniques can be used to separate the first single-crystalline material from underlying materials. In some embodiments, separating the first single-crystalline material from at least the first single-crystalline underlayer, the first etch stop layer, and the second single-crystalline underlayer comprises mechanically removing the first single-crystalline material from at least the first single-crystalline underlayer, the first etch stop layer, and the second single-crystalline underlayer by exfoliation. Other separation methods are described, for example, in International Patent Application Publication No. WO 2017/044577, published on Mar. 16, 2017, filed as International Application No. PCT/US2016/050701 on Sep. 8, 2016, and entitled "Systems and Methods for Graphene Based Layer Transfer," which is incorporated herein by reference in its entirety for all purposes.

In some embodiments, additional single-crystalline material layers can be formed over the first single-crystalline underlayer and subsequently removed from first single-crystalline underlayer. For example, in some embodiments, at least one, at least two, at least three, at least five, at least 10, or more single-crystalline material layers are formed over the first single-crystalline underlayer (e.g., 130 in FIGS. 2A-2D) after the first single-crystalline material (e.g., 210 in FIGS. 2B-2D) is formed over and removed from the first single-crystalline underlayer.

In some cases, it may be desirable to stop using the first single-crystalline underlayer for the growth of single crystalline materials. As one non-limiting example, the formation and removal of a single-crystalline material over a first single-crystalline underlayer may introduce a defect into the first single-crystalline underlayer, which may render the first single-crystalline underlayer unsuitable as a base layer for further single-crystalline material growth. As another non-limiting example, the introduction of contaminants onto a first single-crystalline underlayer may render the first single-crystalline underlayer unsuitable as a base layer for further single-crystalline material growth.

Regardless of the reason, in some embodiments, the method comprises removing at least a portion (e.g., at least 50 vol %, at least 75 vol %, at least 90 vol %, at least 95 vol %, or at least 99 vol %) of the first single-crystalline underlayer and exposing at least a portion (e.g., at least 50%, at least 75%, at least 90%, at least 95%, or at least 99%) of a surface of the first etch stop layer. In some embodiments, all of the first single-crystalline underlayer is removed, after which, a surface of the first etch stop layer is exposed. In the embodiments shown in FIG. 2E, for example, all of first single-crystalline underlayer 130 has been removed such that surface 128 of first etch stop layer 125 has been exposed. (In addition, in FIG. 2D, 2D material 140 has also been removed, which removal can be performed at the same time as or separately from the removal of the first single-crystalline underlayer.) In some embodiments, removal of the first single-crystalline underlayer portion results in direct exposure of the underlying etch stop layer (e.g., as shown in FIG. 2E). In other embodiments, removal of additional material (e.g., an intervening material between the first single-crystalline underlayer and the etch stop layer) is required before the underlying etch stop layer is exposed.

In accordance with certain embodiments, removal of the first single-crystalline underlayer is performed such that the underlying first etch stop layer remains intact. This can be accomplished, for example, using a removal process that selectively removes the first single-crystalline underlayer relative to the first etch stop layer. For example, in some embodiments, removal of the first single-crystalline underlayer is performed using an etchant that etches the first single-crystalline underlayer at a rate that is substantially faster than the rate at which the etchant etches the first etch stop layer. In some embodiments, the rate at which the removal medium (e.g., etchant) removes the first single-crystalline underlayer is at least 2, at least 5, at least 10, at least 100, or at least 1000 times faster than the rate at which the removal medium removes the first etch stop layer. By maintaining the integrity of the first etch stop layer during the removal of the first single-crystalline underlayer, the integrity of the second single-crystalline underlayer (e.g., 115 in FIGS. 2A-2E) can be preserved, which maintains the suitability of the second single-crystalline underlayer as a base layer for the growth of additional single-crystalline materials (described in more detail below).

Certain embodiments comprise removing at least a portion (e.g., at least 50 vol %, at least 75 vol %, at least 90 vol %, at least 95 vol %, or at least 99 vol %) of the first etch stop layer and exposing at least a portion (e.g., at least 50%, at least 75%, at least 90%, at least 95%, or at least 99%) of a surface of the second single-crystalline underlayer and/or at least a portion (e.g., at least 50%, at least 75%, at least 90%, at least 95%, or at least 99%) of a surface of an optional second 2D material layer. In some embodiments, all of the first etch stop layer is removed, after which, a surface of the second single-crystalline underlayer and/or a surface of an optional second 2D material layer is exposed. In the embodiment shown in FIGS. 2E-2F, for example, all of first etch stop layer 125 has been removed such that surface 123 of 2D material 120 has been exposed. In some embodiments, the 2D material has through-holes, and removal of the etch stop layer causes the portions of the second single-crystalline underlayer (e.g., underlayer 115) that are positioned under the through-holes of the 2D material to be exposed. In other embodiments, the 2D material can be free of through-holes. In still other embodiments, the 2D material (e.g., 2D material 120) is not present when first etch stop layer (e.g., layer 125) is removed, resulting in the exposure of a surface of the second single-crystalline underlayer (e.g., 115 in FIG. 2F).

In accordance with certain embodiments, removal of the first etch stop layer is performed such that the underlying second single-crystalline underlayer remains intact. This can be accomplished, for example, using a removal process that selectively removes the first etch stop layer relative to the second single-crystalline underlayer. For example, in some embodiments, removal of the first etch stop layer is performed using an etchant that etches the first etch stop layer at a rate that is substantially faster than the rate at which the etchant etches the second single-crystalline underlayer. In some embodiments, the rate at which the removal medium (e.g., etchant) removes the first etch stop layer is at least 2, at least 5, at least 10, at least 100, or at least 1000 times faster than the rate at which the removal medium removes the second single-crystalline underlayer. Maintaining the integrity of the second single-crystalline underlayer (e.g., 115 in FIGS. 2A-2F) can allow one to subsequently use the second single-crystalline underlayer as a base layer for the growth of additional single-crystalline materials (described in more detail below).

As noted above, the presence of the second 2D material layer during the removal of the first etch stop layer is optional. In some embodiments, the method further comprises depositing a second 2D material onto the exposed portion of the surface of the second single-crystalline underlayer. For example, referring to FIGS. 2E-2F, in some embodiments, 2D material 120 is not present when first etch stop layer 125 is removed. In some such embodiments, 2D material 120 is deposited over second single-crystalline underlayer 115 after first etch stop layer 125 has been removed. Some embodiments comprise growing the second 2D material onto the exposed portion of the surface of the second single-crystalline underlayer. For example, referring to FIG. 2F, in some embodiments, second 2D material 120 is grown over second single-crystalline underlayer 115. Certain embodiments comprise transferring the second 2D material onto the exposed portion of the surface of the second single-crystalline underlayer. For example, referring to FIG. 2F, in some embodiments, second 2D material 120 is transferred onto the exposed surface of second single-crystalline underlayer 115. The 2D material may be deposited (e.g., grown, transferred) using any of the techniques described above with respect to first 2D material layer 140. In certain embodiments, the 2D material comprises graphene and may be transferred using the graphene-based layer transfer (GBLT) techniques described elsewhere herein.

In some embodiments, the method comprises growing a second single-crystalline material over the second single-crystalline underlayer. For example, in FIG. 2G, second single-crystalline material layer 220 has been grown over second single-crystalline underlayer 115.

In some embodiments, the second single-crystalline material is substantially epitaxially matched to the second single-crystalline underlayer and/or to the second 2D material. For example, referring to FIG. 2G, in some embodiments, second single-crystalline material 220 is substantially epitaxially matched to first single-crystalline underlayer 115 but not to second 2D material 120. In some embodiments, second single-crystalline material 220 is substantially epitaxially matched to second 2D material 120 but not to second single-crystalline underlayer 115. In some embodiments, second single-crystalline material 220 is substantially epitaxially matched to both second 2D material 120 and second single-crystalline underlayer 115.

Certain embodiments comprise patterning the second 2D material with at least one through-hole, such that growing the second single-crystalline material comprises epitaxially growing the second single-crystalline material on the second single-crystalline underlayer through the at least one through-hole. For example, in FIG. 2G, second 2D material 120 includes a plurality of through-holes. The through-holes in second 2D material 120 may, in accordance with certain embodiments, allow the second single-crystalline material 220 to "see" second single-crystalline underlayer 115 when second single-crystalline material 220 is being grown, which can allow for epitaxial matching between second single-crystalline material 220 and second single-crystalline underlayer 115. As noted above, however, the invention is not limited to the use of patterned 2D materials, and in other embodiments, the 2D material may be continuous. In some such embodiments, the 2D material is sufficiently thin that the underlying single crystalline material is capable of seeding the growth of the overlying single crystalline material even when the 2D material is continuous such that there is no direct contact between the base layer and the single crystalline material being grown. For example, in some embodiments, the underlying base layer may have a potential field (e.g., created by van der Waals forces and/or other atomic or molecular forces) and a 2D material (e.g., one or more layers of graphene) may be positioned over the base layer but may be so thin that the potential field of the base layer reaches beyond the 2D material and interacts with the region within which a single crystalline layer is formed. As a result, in some embodiments, the potential field from the base layer can affect the growth of the single crystalline material even if the base layer is covered by a continuous 2D material.

Figures 2G, 2H, 2I, 2J, 2K, 2L:
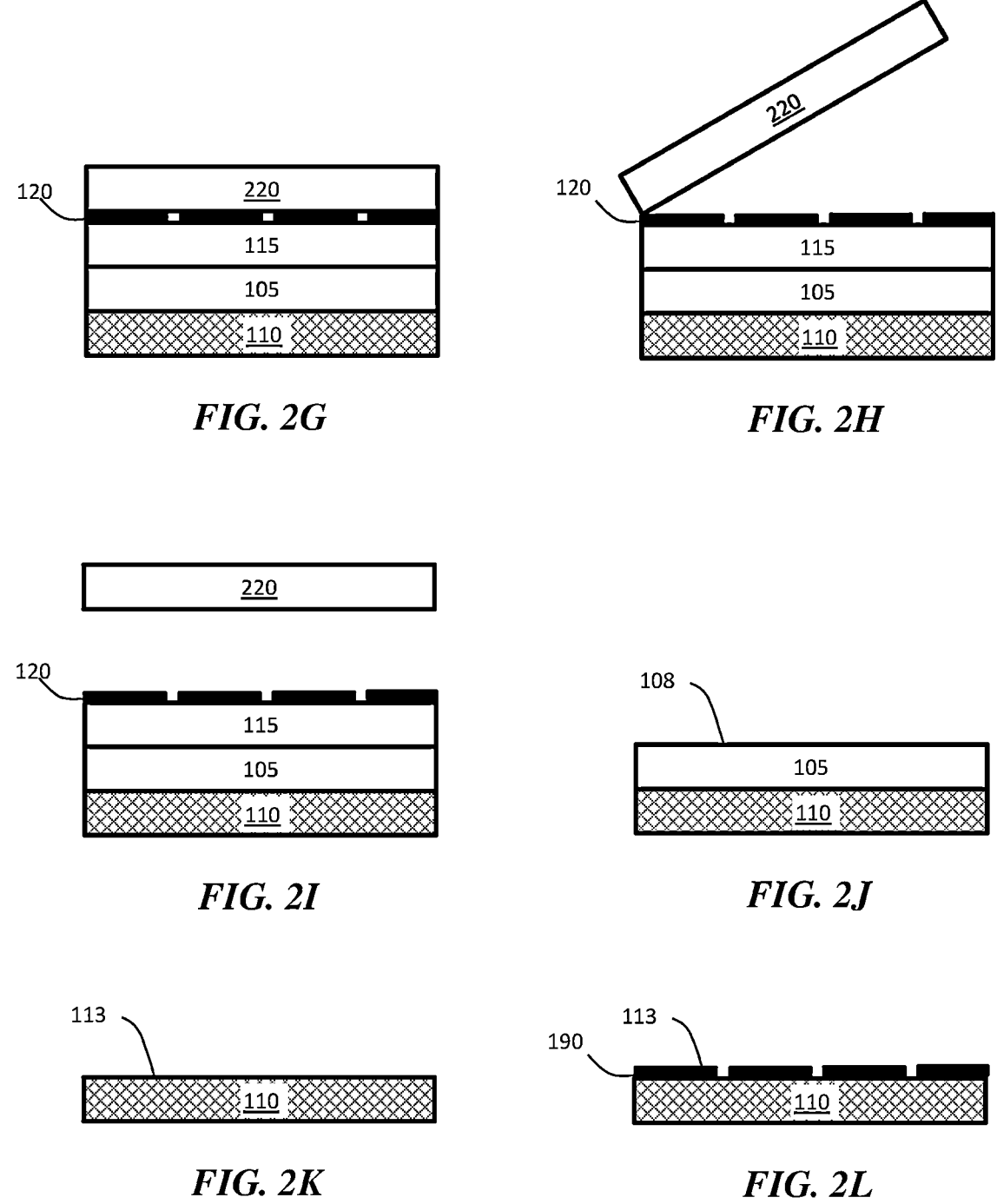

In some embodiments, the method further comprises separating the second single-crystalline material from at least the second single-crystalline underlayer. For example, FIG. 2H shows second single-crystalline material 220 being separated from second single-crystalline underlayer 115 (as well as optional second etch stop layer 105 and optional substrate 110). As shown in FIG. 2I, the separation process has produced a first standalone article comprising second single-crystalline material 220 and a second standalone article comprising second single-crystalline underlayer 115 (as well as optional second etch stop layer 105 and optional substrate 110).

In some embodiments, the method comprises removing the second single-crystalline material from the second 2D material. For example, as shown in FIG. 2H, 2D material 120 remains over second single-crystalline underlayer 115 after the separation step. In other embodiments, the second single-crystalline material is not separated from the second 2D material. For example, in certain embodiments, second 2D material 120 can be separated from second single-crystalline underlayer 115 and, optionally, can be in contact with second single-crystalline material 220 after the separation step.

In some embodiments, the separation step also comprises separating the second single-crystalline material from a second etch stop layer and/or an underlying substrate. For example, in FIGS. 2H-2I, second single-crystalline material layer 220 is also separated from second etch stop layer 105 and substrate 110.

A variety of techniques can be used to separate the second single-crystalline material from underlying materials, including any of the techniques described above with respect to the separation of the first single-crystalline material from underlying materials.

In some embodiments, additional single-crystalline material layers can be formed over the second single-crystalline underlayer and subsequently removed from second single-crystalline underlayer. For example, in some embodiments, at least one, at least two, at least three, at least five, at least 10, or more single-crystalline material layers are formed over the second single-crystalline underlayer (e.g., 115 in FIGS. 2A-2I) after the second single-crystalline material (e.g., 220 in FIGS. 2G-2I) is formed over and removed from the second single-crystalline underlayer.

In some cases, it may be desirable to stop using the second single-crystalline underlayer for the growth of single crystalline materials. As one non-limiting example, the formation and removal of a single-crystalline material over second single-crystalline underlayer may introduce a defect into the second single-crystalline underlayer, which may render the second single-crystalline underlayer unsuitable as a base layer for further single-crystalline material growth. As another non-limiting example, the introduction of contaminants onto the second single-crystalline underlayer may render the second single-crystalline underlayer unsuitable as a base layer for further single-crystalline material growth.

Regardless of the reason, in some embodiments, the method comprises removing at least a portion (e.g., at least 50 vol %, at least 75 vol %, at least 90 vol %, at least 95 vol %, or at least 99 vol %) of the second single-crystalline underlayer and exposing at least a portion (e.g., at least 50%, at least 75%, at least 90%, at least 95%, or at least 99%) of a surface of a second etch stop layer. In some embodiments, all of the second single-crystalline underlayer is removed, after which, a surface of the second etch stop layer is exposed. In the embodiments shown in FIG. 2J, for example, all of second single-crystalline underlayer 115 has been removed such that surface 108 of second etch stop layer 105 has been exposed. (In addition, in FIG. 2J, 2D material 120 has also been removed, which removal can be performed at the same time as or separately from the removal of the second single-crystalline underlayer.) In some embodiments, removal of the second single-crystalline underlayer portion results in direct exposure of the underlying etch stop layer (e.g., as shown in FIGS. 2I-2J). In other embodiments, removal of additional material (e.g., an intervening material between the second single-crystalline underlayer and the second etch stop layer) is required before the underlying second etch stop layer is exposed.

In accordance with certain embodiments, removal of the second single-crystalline underlayer is performed such that the underlying second etch stop layer remains intact. This can be accomplished, for example, using a removal process that selectively removes the second single-crystalline underlayer relative to the second etch stop layer. Suitable methods include any of those described above with respect to the selective removal of the first single-crystalline underlayer. In some embodiments, the rate at which the removal medium (e.g., etchant) removes the second single-crystalline underlayer is at least 2, at least 5, at least 10, at least 100, or at least 1000 times faster than the rate at which the removal medium removes the second etch stop layer. By maintaining the integrity of the second etch stop layer during the removal of the second single-crystalline underlayer, the integrity of the substrate (which, itself, may include one or more pairs of single-crystalline underlayers and etch stop layers) can be preserved, which maintains the suitability of the substrate as a base layer for the growth of additional single-crystalline materials.

Certain embodiments comprise removing at least a portion (e.g., at least 50 vol %, at least 75 vol %, at least 90 vol %, at least 95 vol %, or at least 99 vol %) of the second etch stop layer and exposing at least a portion (e.g., at least 50%, at least 75%, at least 90%, at least 95%, or at least 99%) of a surface of the underlying substrate and/or at least a portion (e.g., at least 50%, at least 75%, at least 90%, at least 95%, or at least 99%) of a surface of an optional third 2D material layer. In some embodiments, all of the second etch stop layer is removed, after which, a surface of the underlying substrate and/or a surface of an optional third 2D material layer is exposed.

In the embodiment shown in FIG. 2K, for example, all of second etch stop layer 105 has been removed such that surface 113 of substrate 110 has been exposed. In other embodiments, an optional third 2D material is present between substrate 110 and second etch stop layer 105, and after the second etch stop layer 105 is at least partially removed, at least a portion of the third 2D material layer is exposed. In some such embodiments, the third 2D material has through-holes, and removal of the second etch stop layer causes the portions of the substrate that are positioned under the through-holes of the 2D material to be exposed.

In accordance with certain embodiments, removal of the second etch stop layer is performed such that the underlying substrate remains intact. This can be accomplished, for example, using a removal process that selectively removes the second etch stop layer relative to the substrate. For example, in some embodiments, removal of the second etch stop layer is performed using an etchant that etches the second etch stop layer at a rate that is substantially faster than the rate at which the etchant etches the substrate. In some embodiments, the rate at which the removal medium (e.g., etchant) removes the second etch stop layer is at least 2, at least 5, at least 10, at least 100, or at least 1000 times faster than the rate at which the removal medium removes the substrate. Maintaining the integrity of the substrate can allow one to subsequently use the substrate as a base layer for the growth of additional single-crystalline materials.

As noted above, the presence of the third 2D material layer during the removal of the second etch stop layer is optional. In some embodiments, the method further comprises depositing a third 2D material onto the exposed portion of the substrate. For example, referring to FIG. 2L, in some embodiments, third 2D material 190 is not present when second etch stop layer 105 is removed. In some such embodiments, third 2D material 190 is deposited over substrate 110 after second etch stop layer 105 has been removed. Some embodiments comprise growing the third 2D material onto the exposed portion of the surface of the substrate. For example, referring to FIG. 2L, in some embodiments, third 2D material layer 190 is grown over substrate 110. While third 2D material layer 190 is depicted as including through-holes, in other embodiments, third 2D material layer 190 is free of through-holes. Certain embodiments comprise transferring the third 2D material onto the exposed portion of the substrate. For example, referring to FIG. 2L, in some embodiments, third 2D material layer 190 is transferred onto the exposed surface of substrate 110. The third 2D material may be deposited (e.g., grown, transferred) using any of the techniques described above with respect to first 2D material layer 140. In certain embodiments, the third 2D material comprises graphene and may be transferred using graphene-based layer transfer (GBLT) techniques described, for example, in International Patent Application Publication No. WO 2017/044577, published on Mar. 16, 2017, filed as International Application No. PCT/US2016/050701 on Sep. 8, 2016, and entitled "Systems and Methods for Graphene Based Layer Transfer," which is incorporated herein by reference in its entirety for all purposes.

In some embodiments, additional single-crystalline materials can be grown over substrate 110 and third 2D material layer 190. Subsequent removal of single-crystalline layers and etch stop layers within substrate 110 can be performed, in accordance with certain embodiments, to provide additional pristine single-crystalline layers that can be used for subsequent growth of single-crystalline material layers.

Figure 3A:
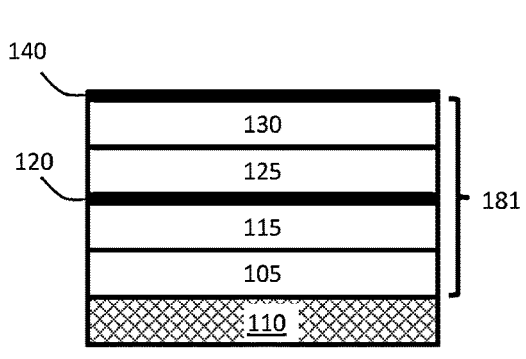
FIGS. 3A-3D are, in accordance with some embodiments, exemplary cross-sectional schematic illustrations showing the patterning of a 2D material layer using a mask.
Figure 3B:
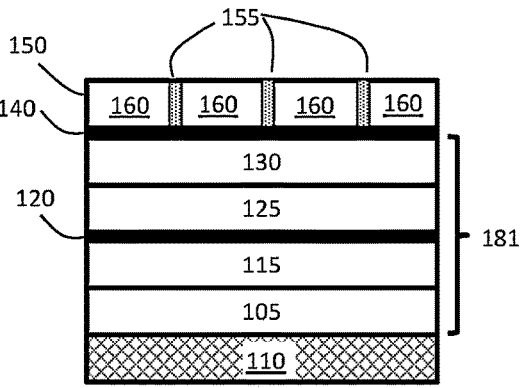
Figure 3C:
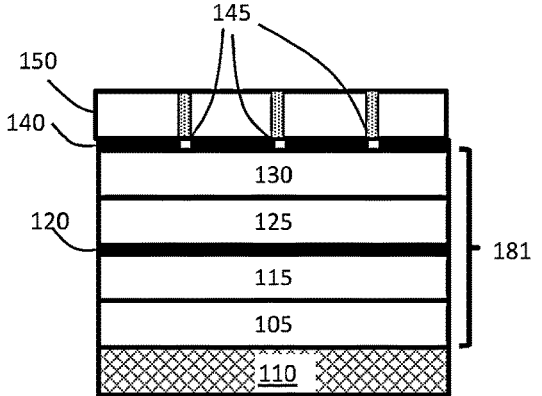

As noted above, in various embodiments, one or more through-holes may be formed in the 2D material. In other embodiments, the 2D material is free of through-holes. In some embodiments, forming through-holes in the 2D material can comprise, in some embodiments, applying a masking material to at least one portion of a surface of the 2D material and exposing the masking material and 2D material to an etchant of the 2D material to form at least one through-hole in the 2D material. An example of one such process is illustrated, for example, in FIGS. 3A-3C. In FIG. 3B, masking material 150 has been positioned over 2D material 140. Masking material 150 comprises a plurality of regions 155 which allow transmission of an etchant through mask material 150 and to 2D material 140. Regions 155 are positioned within region 160, which inhibits the transmission of etchant to 2D material 140. When an etchant is applied, the portions of 2D material below regions 155 are etched, leading to the creation of through-holes 145 in 2D material 140, as shown in FIG. 3C.

Figure 3D:
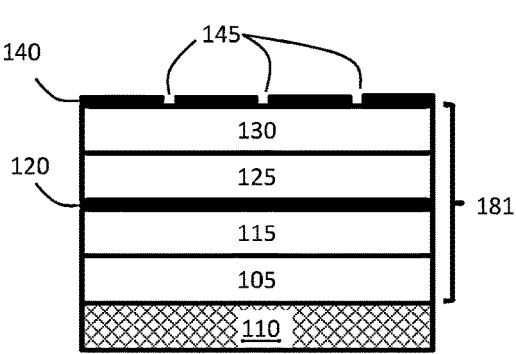

In some embodiments, the method further comprises removing the masking material from the at least one portion of the surface of the 2D material. FIG. 3D, for example, shows the structure of FIG. 3C after masking material 150 has been removed from the portion of the surface of the 2D material 140 that was below region 160. In FIG. 3D, through-holes 145 are now directly exposed to the outside environment.

As noted above, a variety of materials can be used as single-crystalline base layers (e.g., layers 130 and/or 115 in the figures). Suitable materials from which the single-crystalline base layers can be made include, but are not limited to, III-V semiconductors (e.g., III-N semiconductors), IV semiconductors, and II-VI semiconductors. In some embodiments, the single-crystalline base layers comprise Si, Ge, SiC, SiGe, AlN, GaN, InN, GaP, AlP, AlAs, GaAs, GaP, and/or InP.

Also as noted above, a variety of materials can be used as single-crystalline etch stop layers (e.g., layers 105 and/or 125 in the figures). Suitable materials from which the single-crystalline etch stop layers can be made include, but are not limited to, III-V semiconductors (e.g., III-N semiconductors), IV semiconductors, and II-VI semiconductors. In some embodiments, the single-crystalline etch stop layers comprise Si, Ge, SiC, SiGe, AlN, GaN, InN, GaP, AlP, AlAs, GaAs, GaP, and/or InP.

As a non-limiting example, in some embodiments, a structure comprises a single-crystalline GaAs substrate. In some such embodiments, the structure comprises a plurality of single-crystalline AlAs etch stop layers and a plurality of single-crystalline GaAs base layers over the single-crystalline GaAs substrate in an alternating arrangement. In some embodiments, one of the plurality of single-crystalline AlAs etch stop layers is directly adjacent to the single-crystalline GaAs substrate. In some embodiments, the structure comprises a multi-layer stack over the single-crystalline GaAs substrate. In some embodiments, the multi-layer stack comprises a first single-crystalline AlAs etch stop layer over the single-crystalline GaAs substrate; a first single-crystalline GaAs base layer over the first single-crystalline AlAs etch stop layer; a second single-crystalline AlAs etch stop layer over the first single-crystalline GaAs base layer; and a second single-crystalline GaAs base layer over the second single-crystalline AlAs etch stop layer.

As another non-limiting example, in some embodiments, a structure comprises a single-crystalline InP substrate. In some such embodiments, the structure comprises a plurality of single-crystalline InGaAs etch stop layers and a plurality of single-crystalline InP base layers over the single-crystalline InP substrate in an alternating arrangement. In some embodiments, one of the plurality of single-crystalline InGaAs etch stop layers is directly adjacent to the single-crystalline InP substrate. In some embodiments, the structure comprises a multi-layer stack over the single-crystalline InP substrate. In some embodiments, the multi-layer stack comprises a first single-crystalline InGaAs etch stop layer over the single-crystalline InP substrate; a first single-crystalline InP base layer over the first single-crystalline InGaAs etch stop layer; a second single-crystalline InGaAs etch stop layer over the first single-crystalline InP base layer; and a second single-crystalline InP base layer over the second single-crystalline InGaAs etch stop layer.

In some embodiments, a method comprises growing a first single-crystalline material over a stack comprising a two-dimensional (2D) material, a first single-crystalline GaAs underlayer below the 2D material, a first AlAs etch stop layer below the first single-crystalline GaAs underlayer, and a second single-crystalline GaAs underlayer below first AlAs etch stop layer, such that the first single-crystalline material is substantially epitaxially matched to the first single-crystalline GaAs underlayer below the 2D material and/or epitaxially matched to the 2D material. In some embodiments, the method comprises separating the first single-crystalline material from at least the first single-crystalline GaAs underlayer, the first AlAs etch stop layer, and the second single-crystalline GaAs underlayer. In some embodiments, the method comprises removing at least a portion of the first single-crystalline GaAs underlayer and exposing at least a portion of a surface of the first AlAs etch stop layer. In some embodiments, the method comprises removing at least a portion of the first AlAs etch stop layer and exposing at least a portion of a surface of the second single-crystalline GaAs underlayer and/or at least a portion of a surface of an optional second 2D material. In some embodiments, the method comprises growing a second single-crystalline material over the second single-crystalline GaAs underlayer.

In some embodiments, a method comprises depositing a first single-crystalline AlAs etch stop layer onto a single-crystalline GaAs substrate. In some embodiments, the method comprises depositing a first single-crystalline GaAs base layer over the first single-crystalline AlAs etch stop layer. In some embodiments, the method comprises depositing a second single-crystalline AlAs etch stop layer over the first single-crystalline GaAs base layer. In some embodiments, the method comprises depositing a second single-crystalline GaAs base layer over the second single-crystalline AlAs etch stop layer.

In some embodiments, a method comprises growing a first single-crystalline material over a stack comprising a two-dimensional (2D) material, a first single-crystalline InP underlayer below the 2D material, a first InGaAs etch stop layer below the first single-crystalline InP underlayer, and a second single-crystalline InP underlayer below first InGaAs etch stop layer, such that the first single-crystalline material is substantially epitaxially matched to the first single-crystalline InP underlayer below the 2D material and/or epitaxially matched to the 2D material. In some embodiments, the method comprises separating the first single-crystalline material from at least the first single-crystalline InP underlayer, the first InGaAs etch stop layer, and the second single-crystalline InP underlayer. In some embodiments, the method comprises removing at least a portion of the first single-crystalline InP underlayer and exposing at least a portion of a surface of the first InGaAs etch stop layer. In some embodiments, the method comprises removing at least a portion of the first InGaAs etch stop layer and exposing at least a portion of a surface of the second single-crystalline InP underlayer and/or at least a portion of a surface of an optional second 2D material. In some embodiments, the method comprises growing a second single-crystalline material over the second single-crystalline InP underlayer.

In some embodiments, a method comprises depositing a first single-crystalline InGaAs etch stop layer onto a single-crystalline InP substrate. In some embodiments, the method comprises depositing a first single-crystalline InP base layer over the first single-crystalline InGaAs etch stop layer. In some embodiments, the method comprises depositing a second single-crystalline InGaAs etch stop layer over the first single-crystalline InP base layer. In some embodiments, the method comprises depositing a second single-crystalline InP base layer over the second single-crystalline InGaAs etch stop layer.

Generally, the materials used for the single-crystalline base layers and the etch stop layers will depend upon the single-crystalline materials one wishes to grow from the base layers and the ability to select etchants that are sufficiently selective to preserve the integrity of underlying base layers when removing overlying base layers and etch stop layers. Those of ordinary skill in the art, given the disclosure provided herein, would be capable of selecting suitable materials for use in the etch stop layers and the single-crystalline base layers. Those of ordinary skill in the art, given the disclosure provided herein, would also be capable of selecting suitable etchants to selectively remove spent single-crystalline base layers and etch stop layers while preserving the integrity of underlying single-crystalline base layers.

For example, in some embodiments, HF (e.g., diluted HF) could be used to selectively etch AlAs (e.g., to remove AlAs from GaAs). As another non-limiting example, $H_2O_2$ can be used to selectively etch Ge (e.g., to remove Ge from GaAs). As yet another non-limiting example, phosphoric acid can be used to selectively etch InGaAs (e.g., to remove InGaAs from InP). Those of ordinary skill in the art, given the disclosure provided herein, would be capable of selecting additional combinations of etchants, etch stop layer materials, and single-crystalline base layers for performing the methods described herein.

As noted above, a variety of materials can be used as 2D materials (e.g., layers 120 and/or 140 in the figures). In some embodiments, the 2D material is or comprises graphene. In certain embodiments, the 2D material can comprise a transition metal dichalcogenide (TMD) monolayer, which is an atomically thin semiconductor of the type $MQ_2$, where M is a transition metal atom (e.g., Mo, W, etc.) and Q is a chalcogen atom (e.g., S, Se, or Te). In some embodiments, the 2D material can include $MoS_2$ and $WSe_2$, among other materials. In yet another example, the 2D material can comprise 2D boron nitride (B N). In some embodiments, the 2D material can be arranged as a plurality of atomic layers (e.g., 2, 3, 4, 5, 6, 7, or more atomic layers). For example, in some embodiments, a plurality of graphene layers (e.g., 2, 3, 4, 5, 6, 7, or more graphene layers thick) can be used. In some embodiments, the 2D material is an atomically thin material.

In some embodiments, the 2D material layer(s) comprise graphene. Compared to conventional methods, graphene-based layer transfer techniques can provide one or more advantages. First, because graphene is crystalline, it is a suitable substrate for growing epitaxial over-layers. Second, graphene's weak interaction with many other materials can substantially relax the lattice mismatching requirements for epitaxial growth, potentially permitting the growth of most semiconducting films with low defect densities. Third, the single-crystalline materials (e.g., functional devices or device layers) grown on graphene substrates can generally be easily and precisely released from the substrate owing to graphene's weak Van der Waals interactions, which permits rapid mechanical release of epitaxially grown layers without post-release reconditioning of the released surface. Fourth, graphene's mechanical robustness can maximize its reusability for multiple growth/release cycles.

A variety of materials can be used as the substrate (e.g., substrate 110 in the figures). In some embodiments, the substrate is a single-crystalline substrate. In certain embodiments, the substrate is a multi-layer substrate (e.g., comprising one or more single-crystalline base layers and one or more single-crystalline etch stop layers in an alternating configuration, and/or comprising one or more 2D materials). Suitable materials from which the substrate can be made include, but are not limited to, III-V semiconductors (e.g., III-N semiconductors), IV semiconductors, II-VI semiconductors, graphene, a TMD monolayer, $MoS_2$, $WSe_2$, BN, and/or an atomically thin material. In some embodiments, the substrate comprises Si, Ge, SiC, SiGe, AN, GaN, InN, GaP, AlP, AlAs, GaAs, GaP, and/or InP.

U.S. Provisional Application No. 62/895,863, filed Sep. 4, 2019, and entitled "Multi-Regional Epitaxial Growth and Related Systems and Articles" is incorporated herein by reference in its entirety for all purposes.

The following example is intended to illustrate certain embodiments of the present invention, but does not exemplify the full scope of the invention.

Example

This example describes wafer recycling by epitaxial growth and transfer on (patterned van der Waals material (s))/(multilayer stack of epitaxial layers). In particular, this example describes the preparation of a stack of multiple InP and InGaAs layers in an alternating layered architecture for wafer recycling.

First, multiply stacked materials (InGaAs/InP/InGaAs . . . InP/InGaAs) were epitaxially grown on substrates in a metal organic chemical vapor deposition (MOCVD) chamber, as shown in, e.g., FIGS. 4A-4D and FIG. 5A.

In FIGS. 4A-4D, 402 is InP, 404 is InGaAs, and 406 is graphene.

Figure 5A:
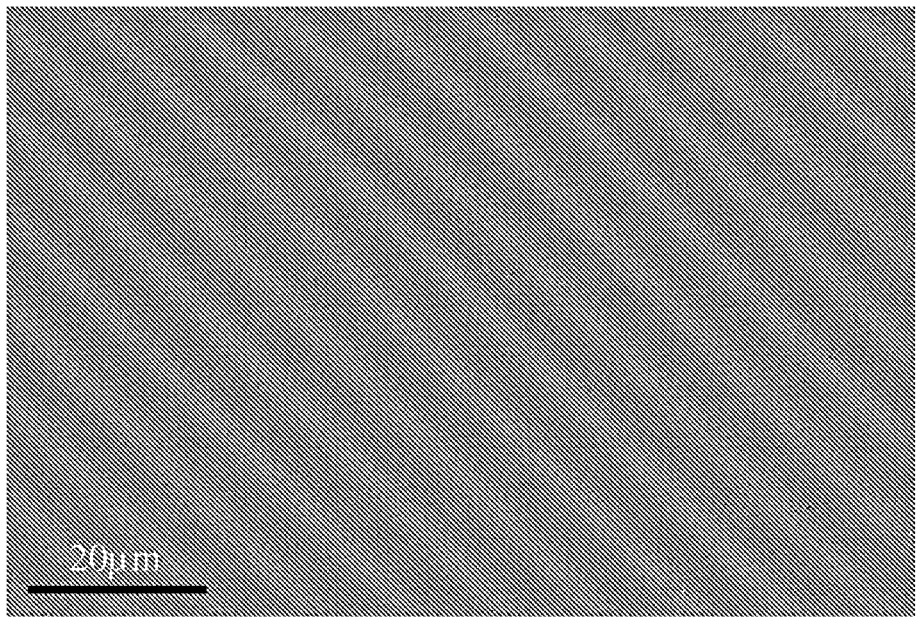
FIG. 5A is a scanning electron microscopy (SEM) image of an InGaAs surface on a stack having InGaAs/InP/ . . . InP/InGaAs, in accordance with some embodiments.
Figure 5B:
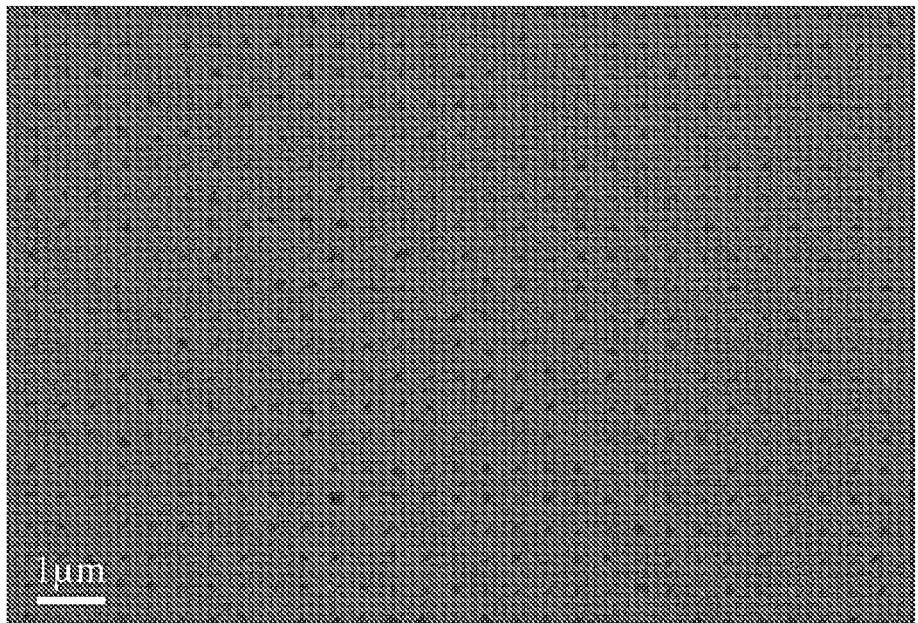
FIG. 5B is an SEM image of a periodic pattern made on graphene on a stack, in accordance with some embodiments.

Graphene, a van der Waals material, was grown on a Ge wafer under the flow of a mixture of $CH_4$, $H_2$ and Ar in a chemical vapor deposition (CVD) chamber first, and then the graphene was transferred onto a target stack to cover the target stack's surface with the van der Waals material. Later, a periodic pattern was made in the graphene via interference lithography as shown in FIG. 5B, having a few hundreds of nanometers pitch to the pattern. Although some area of the van der Waals surface was patterned and no longer covered by van der Waals materials, the majority of the surface was still van der Waals bonding. Therefore, there was still an opportunity to exfoliate the top epitaxially grown material (also referred to as an epilayer) at the van der Waals layer after growing the epilayer.

FIG. 4A is a schematic diagram showing indium phosphide (InP) growth on patterned graphene on a stack comprising InGaAs/InP/InGaAs . . . /InP, in accordance with some embodiments. The InP layer was able to be peeled off, at least because a majority of the graphene still remained, which allowed for the peeling off of the InP layer.

Here, an InP epilayer was grown on the patterned graphene surface and Ni was deposited on top of the InP epilayer to induce a stress energy to peel off the InP epilayer, which generated a freestanding InP layer. After successfully exfoliating the epilayer, there was no macroscopic damage on the InGaAs, but the process left behind micro spalling on the InGaAs surface, at least because of partial covalent bonding on a direct epitaxy area. To obtain a pristine surface again, the patterned graphene and InGaAs/InP were selectively etched as shown, e.g., in FIGS. 4A-4B, and another InGaAs surface was exposed again. The surface morphology of InGaAs was measured by atomic force microscopy (AFM), which showed an extremely smooth surface having an epitaxial underlayer quality like a pristine surface; therefore, further epitaxial growth could be performed over this InGaAs layer.

Figure 6:
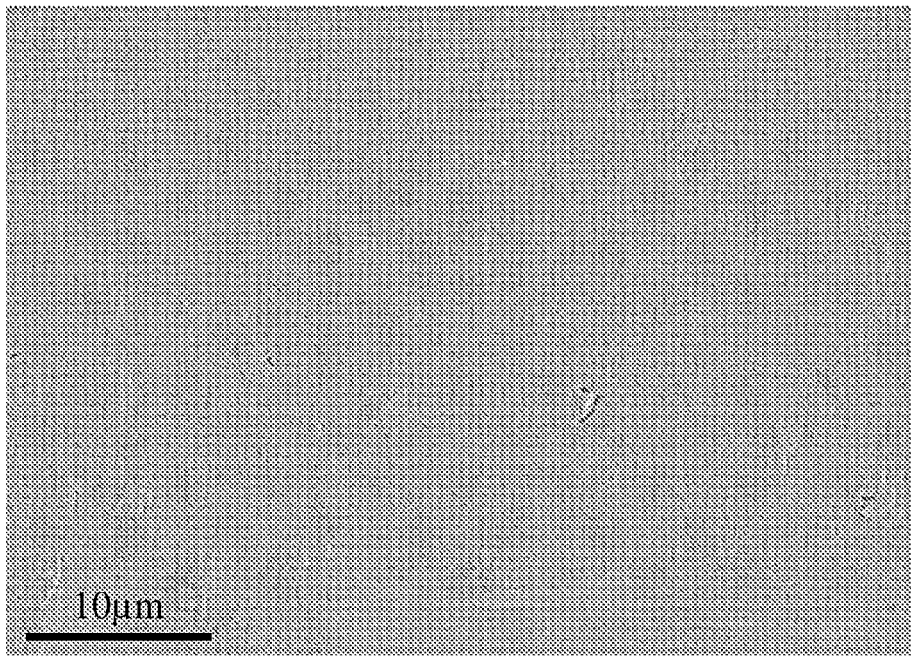
FIG. 6 is an SEM image of epitaxially grown InP on patterned graphene on a stack of InGaAs/InP, in accordance with some embodiments.

Graphene was transferred onto the surface of InGaAs and the same process was repeated, including interference patterning, etching some part of graphene, and epitaxial growth of InP, as shown in, e.g., FIG. 4C-4D. After epitaxial growth of InP, the smooth surface of InP shown in FIG. 6 was obtained, having excellent morphology (low roughness).

Electron backscatter diffraction (EBSD) confirmed that most areas had single crystallinity. Repeating this process in principle would ultimately generate freestanding InP, and would facilitate unlimited wafer-recycling.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Some embodiments may be embodied as a method, of which various examples have been described. The acts performed as part of the methods may be ordered in any suitable way. Accordingly, embodiments may be constructed in which acts are performed in an order different than illustrated, which may include different (e.g., more or less) acts than those that are described, and/or that may involve performing some acts simultaneously, even though the acts are shown as being performed sequentially in the embodiments specifically described above.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
growing a first single-crystalline material over a stack comprising a two-dimensional (2D) material, a first single-crystalline underlayer below the 2D material, a first etch stop layer below the first single-crystalline underlayer, and a second single-crystalline underlayer below the first etch stop layer, such that the first single-crystalline material is substantially epitaxially matched to the first single-crystalline underlayer below the 2D material and/or epitaxially matched to the 2D material, wherein the first single-crystalline material is in direct contact with the 2D material and the 2D material is in direct contact with the first single-crystalline underlayer, and wherein the 2D material comprises graphene, a transition metal dichalcogenide, or boron nitride;
separating the first single-crystalline material from at least the first single-crystalline underlayer, the first etch stop layer, and the second single-crystalline underlayer;
removing at least a portion of the first single-crystalline underlayer and exposing at least a portion of a surface of the first etch stop layer;
removing at least a portion of the first etch stop layer and exposing at least a portion of a surface of the second single-crystalline underlayer and/or at least a portion of a surface of an optional second 2D material; and
growing a second single-crystalline material over the second single-crystalline underlayer.

2. The method of claim 1, further comprising patterning the 2D material with at least one through-hole, such that growing the first single-crystalline material comprises epitaxially growing the first single-crystalline material on the first single-crystalline underlayer through the at least one through-hole.

3. The method of claim 2, wherein the patterning the 2D material comprises applying a masking material to at least one portion of a surface of the 2D material and exposing the masking material and 2D material to an etchant of the 2D material to form the at least one through-hole in the 2D material.

4. The method of claim 3, wherein the patterning the 2D material further comprises removing the masking material from the at least one portion of the surface of the 2D material.

5. The method of claim 1, wherein the separating comprises mechanically removing the first single-crystalline material from the at least the first single-crystalline underlayer, the first etch stop layer, and the second single-crystalline underlayer by exfoliation.

6. The method of claim 1, wherein the separating comprises removing the first single-crystalline material from the 2D material.

7. The method of claim 1, wherein the removing the at least the portion of the first single-crystalline underlayer comprises removing all of the first single-crystalline underlayer.

8. The method of claim 1, wherein the removing the at least the portion of the first etch stop layer comprises removing all of the first etch stop layer.

9. The method of claim 1, further comprising depositing a second 2D material onto the exposed surface of the second single-crystalline underlayer.

10. The method of claim 9, wherein the depositing the second 2D material onto the exposed surface of the second single-crystalline underlayer comprises growing the second 2D material onto the exposed surface of the second single-crystalline underlayer.

11. The method of claim 9, wherein the depositing the second 2D material onto the exposed surface of the second single-crystalline underlayer comprises transferring the second 2D material onto the exposed surface of the second single-crystalline underlayer.

12. The method of claim 9, further comprising patterning the second 2D material with at least one through-hole, and wherein growing the second single-crystalline material over the second single-crystalline underlayer comprises epitaxially growing the second single-crystalline material on the second single-crystalline underlayer through the at least one through-hole.

13. The method of claim 1, wherein the 2D material comprises graphene.

14. The method of claim 13, wherein the graphene comprises a single layer of graphene.

15. The method of claim 13, wherein the graphene comprises a plurality of graphene layers.

16. The method of claim 1, wherein the 2D material is an atomically thin material.

17. The method of claim 1, wherein the separating comprises releasing the first single-crystalline material from the 2D material.

18. The method of claim 17, wherein the 2D material interacts with the first single-crystalline material via Van der Waals interactions that permit the releasing the first single-crystalline material from the 2D material.

19. A method comprising:
depositing a first single-crystalline etch stop layer onto a single-crystalline substrate;
depositing a first single-crystalline base layer over the first single-crystalline etch stop layer;
depositing a 2D material onto the first single-crystalline base layer, wherein the 2D material is an atomically thin material;
depositing a second single-crystalline etch stop layer over the first single-crystalline base layer; and
depositing a second single-crystalline base layer over the second single-crystalline etch stop layer.

20. The method of claim 19, wherein the depositing the first single-crystalline etch stop layer comprises growing the first single-crystalline etch stop layer onto the single-crystalline substrate.

21. The method of claim 19, wherein the depositing the first single-crystalline etch stop layer comprises transferring the first single-crystalline etch stop layer onto the single-crystalline substrate.

22. The method of claim 19, wherein the depositing the 2D material onto the first single-crystalline base layer comprises depositing the 2D material directly onto the first single-crystalline base layer.

23. The method of claim 19, wherein the depositing the 2D material onto the first single-crystalline base layer occurs before depositing the second single-crystalline etch stop layer.

24. The method of claim 19, wherein the 2D material comprises graphene.

25. The method of claim 19, wherein the depositing the second single-crystalline etch stop layer comprises depositing the second single-crystalline etch stop layer over the 2D material.

26. The method of claim 19, wherein the 2D material comprises a transition metal dichalcogenide or boron nitride.

27. The method of claim 19, wherein the second single-crystalline etch stop layer is in direct contact with the 2D material.

28. The method of claim 19, wherein the 2D material interacts with the second single-crystalline etch stop layer via Van der Waals interactions that permit releasing the second single-crystalline etch stop layer from the 2D material.

* * * * *